US009543965B1

(12) United States Patent
Ding

(10) Patent No.: US 9,543,965 B1
(45) Date of Patent: Jan. 10, 2017

(54) INTERPOSER WITH EMBEDDED CLOCK NETWORK CIRCUITRY

(71) Applicant: Altera Corporation, San Jose, CA (US)

(72) Inventor: Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 376 days.

(21) Appl. No.: 14/046,467

(22) Filed: Oct. 4, 2013

(51) Int. Cl.
*G11C 8/18* (2006.01)
*H03L 7/04* (2006.01)
*G11C 5/06* (2006.01)
*G06F 1/10* (2006.01)

(52) U.S. Cl.
CPC . *H03L 7/04* (2013.01); *G06F 1/10* (2013.01); *G11C 5/06* (2013.01)

(58) Field of Classification Search
CPC ..................................... H03L 7/04; G06F 1/10
See application file for complete search history.

(56) References Cited

U.S. PATENT DOCUMENTS

| 5,164,817 | A | 11/1992 | Eisenstadt et al. |
| 5,656,963 | A | 8/1997 | Masleid et al. |
| 5,760,478 | A | 6/1998 | Bozso et al. |
| 5,866,924 | A | 2/1999 | Zhu |
| 5,923,188 | A | 7/1999 | Kametani et al. |
| 6,323,942 | B1 | 11/2001 | Bamji |
| 6,461,895 | B1 * | 10/2002 | Liang ........................ G11C 7/02 257/E23.067 |
| 7,679,416 | B2 | 3/2010 | Cheng et al. |
| 8,461,873 | B2 * | 6/2013 | Ishii .......................... G06F 1/10 326/93 |
| 2005/0057286 | A1 * | 3/2005 | Shepard ..................... G06F 1/10 327/141 |
| 2005/0114820 | A1 * | 5/2005 | Restle ........................ G06F 1/10 327/291 |
| 2005/0207238 | A1 * | 9/2005 | Siniaguine ................ G06F 1/10 365/189.11 |
| 2007/0046385 | A1 * | 3/2007 | Forbes ....................... G06F 1/10 331/107 SL |
| 2008/0150605 | A1 * | 6/2008 | Chueh ........................ G06F 1/10 327/292 |
| 2008/0204104 | A1 * | 8/2008 | Peng .................... H01L 25/0657 327/293 |
| 2013/0049826 | A1 * | 2/2013 | Kim .......................... H03L 7/00 327/141 |
| 2013/0336082 | A1 * | 12/2013 | Khawshe ............... G11C 5/005 365/233.12 |

OTHER PUBLICATIONS

Ngai, U.S. Appl. No. 13/484,108, filed May 30, 2012.

* cited by examiner

*Primary Examiner* — Thomas Lee
*Assistant Examiner* — Chad Erdman
(74) *Attorney, Agent, or Firm* — Michael H. Lyons

(57) ABSTRACT

An integrated circuit package includes an interposer with an embedded clock network formed by multiple clock trees. A die with first and second clock circuits is disposed over the interposer. At least one of the first and second clock trees is a resonant clock tree and both the first and second clock circuits may provide clock signals at different frequencies. The first clock circuit may provide clock signals at one frequency to a clock tree in the embedded clock network while the second clock circuit may provide clock signals at another frequency to another clock tree in the embedded clock tree network.

20 Claims, 8 Drawing Sheets

US 9,543,965 B1

INTERPOSER WITH EMBEDDED CLOCK NETWORK CIRCUITRY

BACKGROUND

Integrated circuit (IC) devices include circuits or logic elements that may be used to perform any of a variety of functions. As an example, a field programmable gate array (FPGA) device includes configurable logic elements that may be adapted to perform a variety of functions. As another example, an application specific integrated circuit (ASIC) device, though generally not configurable, may be designed to perform specific desired functions. Such devices, either configurable or not configurable, are relatively complex and generally use clock signals to synchronize different circuit elements in the device.

Accordingly, an IC device generally includes a clock tree structure or clock network that is used to route clock signals to different parts of the IC. The clock network, therefore, is an important component in an IC as its performance may impact other circuitry within the IC. To ensure proper synchronization, a balanced clock structure is preferred as it minimizes clock skew when clock signals are transmitted to different parts of the IC.

SUMMARY

Circuitry and techniques for routing clock signals in an IC package are provided. Embodiments of the present invention include circuits and techniques to form an IC package with an interposer with an embedded clock tree structure.

It is appreciated that the present invention can be implemented in numerous ways, such as a process, an apparatus, a system, or a device. Several inventive embodiments of the present invention are described below.

An integrated circuit package may include a die and an interposer. The interposer includes an embedded clock network with multiple clock trees. The die is disposed over the interposer. The die has first and second clock circuits that provide clock signals at first and second frequencies, respectively. As an example, the first clock circuit may provide clock signals at a first frequency to one clock tree in the embedded clock network in the interposer while the second clock circuit may provide clock signals at a second frequency to another clock tree in the embedded clock network. At least one of the clock trees in the embedded clock network may be a resonant clock tree.

Another integrated circuit package may include a die with multiple clock sources and an interposer coupled to the die. The interposer is coupled to the die via interconnects that may be formed by solder balls, metal traces, vias, wires, etc. The interposer includes a resonant clock network that is driven by at least one clock source in the die that is disposed over the interposer. The resonant clock network may include multiple sub-networks where each sub-network is adaptable to receive clock signals over a range of frequency bands from different clock sources.

A method of forming a clock network for an IC in an IC package may include forming multiple resonant clock trees in an interposer. Clock signals from a first clock source on the IC are selectively routed to a resonant clock tree in the interposer and clock signals from a second clock source on the IC are selectively routed to another resonant clock tree in the interposer. The first and second clock sources may provide clock signals at different frequencies. The resonant clock trees form at least a portion of the clock network for the IC and the respective clock signals from the first and second resonant clock trees may be routed via through silicon vias (TSVs) in the interposer to the IC.

DETAILED DESCRIPTION

The embodiments provided herein include circuitry and techniques to route clock signals and form a clock network in an integrated circuit (IC) package. These embodiments can be advantageously used to provide a clock distribution network in a 2.5-dimensional (2.5D) or 3-dimensional (3D) package, where undesirable clock skew between the clock signals in the clock distribution tree is substantially reduced as the clock signals are distributed between the dies of the 2.5D/3D package through various interconnect paths including solder bumps, wires, through silicon vias, etc., within the IC package.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
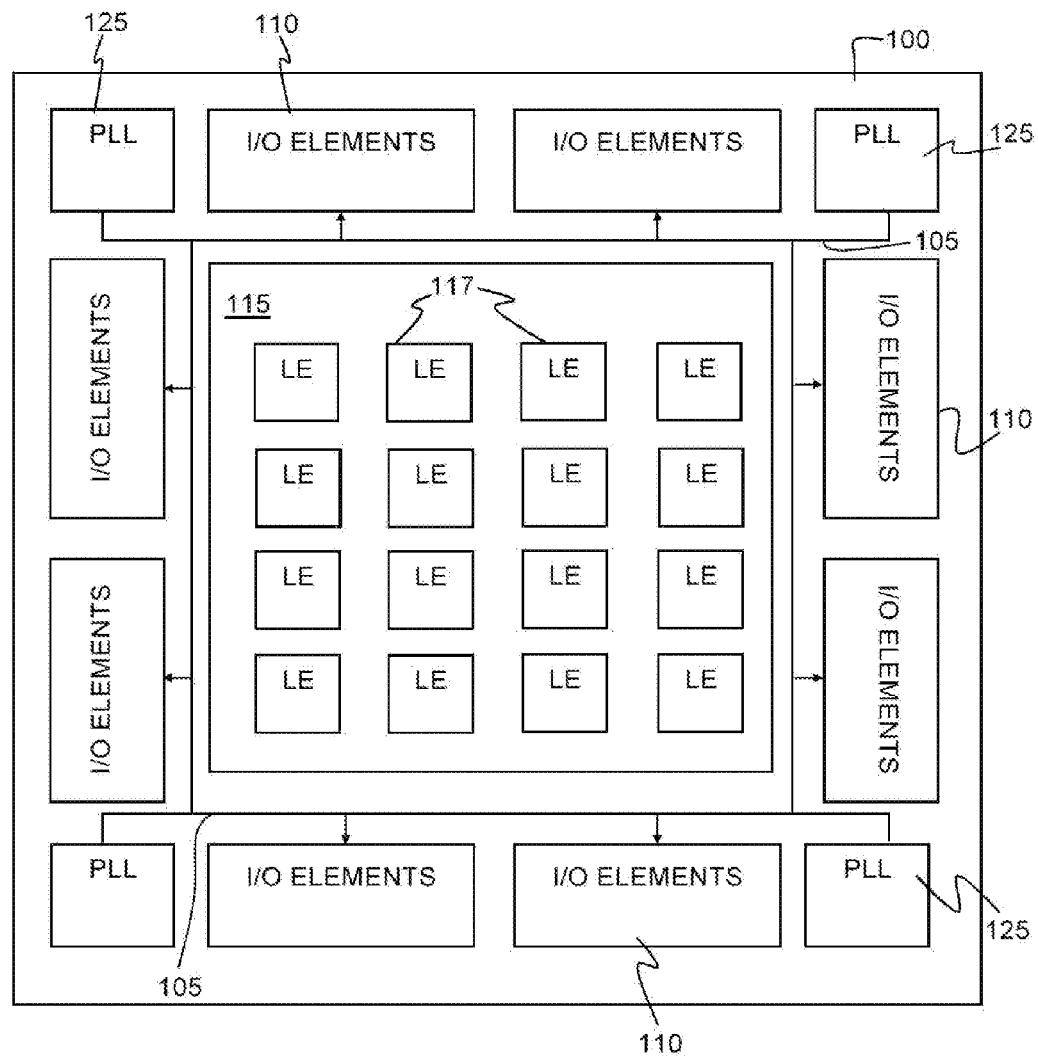
FIG. 1 is a simplified block diagram of an integrated circuit in accordance with one embodiment of the present invention.

FIG. 1, meant to be illustrative and not limiting, shows a simplified block diagram of IC 100 that can implement embodiments of the present invention. IC 100 includes core logic region 115 and input-output elements 110. Other auxiliary circuits, such as phase-locked loops (PLLs) 125 for clock generation and timing, can be located outside the core logic region 115 (e.g., at corners of IC 100 and adjacent to input-output elements 110).

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs may be configured to perform logical functions desired by the user. Configuration data loaded into configuration memory can be used to produce control signals that configure the LEs and groups of LEs and LABs to perform the desired logical functions.

Signals received from external circuitry at input-output elements 110 may be routed from input-output elements 110 to core logic region 115 and other logic blocks on IC 100. Core logic region 115 and other logic blocks on IC 100 may accordingly perform functions based on the signals received. Signals may be sent from core logic region 115 and other relevant logic blocks of IC 100 to other external circuitry or components that may be connected to IC 100 through input-output elements 110.

In the embodiment of FIG. 1, input-output elements 110 may include input-output buffers that connect IC 100 to other external components. Signals from core region 115 may be transmitted through input-output elements 110 to external components that may be connected to IC 100. A single device like IC 100 can potentially support a variety of different interfaces and each individual input-output bank 110 can support a different input-output standard with a different interface or a different voltage level.

In the embodiment of FIG. 1, IC 100 includes clock network 105. It should be appreciated that clock network 105 may be used to transmit clock signals from clock circuits (e.g., PLLs 125) to various parts of IC 100. In one embodiment, clock network 105 may be routing paths of a bigger clock network formed on an off-chip element (e.g., an interposer, another IC, etc.) that is external to IC 100. As an example, clock network 105 may be formed by different clock structures (not shown) that extend from the clock circuits to different logic blocks on IC 100 (e.g., input-output elements 110, core logic region 115).

Figure 2A:
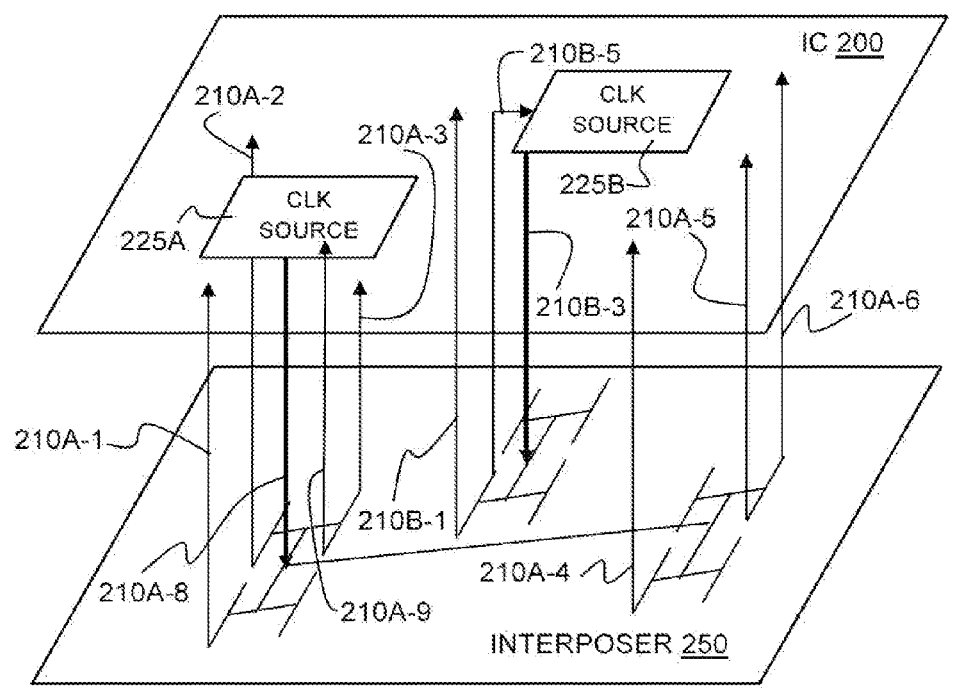
FIG. 2A shows an illustrative integrated circuit with multiple clock sources and an interposer with an embedded clock tree network in accordance with one embodiment the present invention.

FIG. 2A shows illustrative IC 200 with multiple clock sources and interposer 250 with an embedded clock tree network as one embodiment in accordance with the present invention. As shown in FIG. 2A, IC 200 includes clock sources 225A and 225B. It should be noted that other circuit blocks and interconnect paths on IC 200 are not shown in order to not unnecessarily obscure the present invention. In one embodiment, clock sources 225A and 225B may be PLL circuits, similar to PLL circuits 125 of FIG. 1, that may be used to provide clock signals for synchronizing signals between different logic elements (not shown) in IC 200.

Clock signals may be transmitted between IC 200 and interposer 250 via various interconnects. Various interconnects (represented as arrows) are shown in FIG. 2A. Examples of interconnects (or more specifically, conductive elements that may form part of the interconnects) include microbumps on IC 200, metal traces, vias, through silicon vias (TSVs) in interposer 250, contact pads (all not shown in FIG. 2A). The interconnects allow the clock sources on the IC 200 to be coupled to the embedded clock tree network, and the clock signals from the embedded clock tree network to be transmitted to different locations (or circuit/logic blocks) on IC 200. As an example, clock signals are transmitted from clock source 225A to the embedded clock tree network on interposer 250 via interconnect 210A-8 and clock signals from the embedded clock tree network may be transmitted back to IC 200 via interconnects 210A-1, 210A-2, 210A-3, 210A-4, 210A-5, and 210A-6. Accordingly, clock source 225B transmits clock signals to the embedded clock tree network on interposer 250 via interconnect 210B-3 and the embedded clock tree network may transmit clock signals back to IC 200 via interconnect 210B-1. In addition, the clock signals from the embedded clock tree network may be transmitted back to their respective clock sources 225A and 225B as feedback clock signals via interconnects 210A-9 and 210B-5, respectively.

In the example of FIG. 2A, the embedded clock tree network in interposer 250 consists of two sub-networks. One of the sub-networks is driven by clock source 225A while another is driven by clock source 225B. As an example, clock source 225A may provide clock signals at one frequency while clock source 225B may provide clock signals at another frequency. These clock signals may be supplied to the clock tree network embedded in interposer 250 via the various interconnects 210A-1—210A-6 and 210B-1 as described above.

In one embodiment, the embedded clock tree network includes multiple sub-networks (or clock trees) that may include a balanced H-tree clock network. Each sub-network may receive clock signals over multiple frequency bands from multiple clock sources on IC 200. The embedded clock network may be a resonant clock network and the frequency of each sub-network may be configurable. Additionally, each sub-network may be a resonant tree that may be driven by multiple sources, such as a PLL, a delay-locked loop (DLL) and a clock buffer.

Figure 2B:
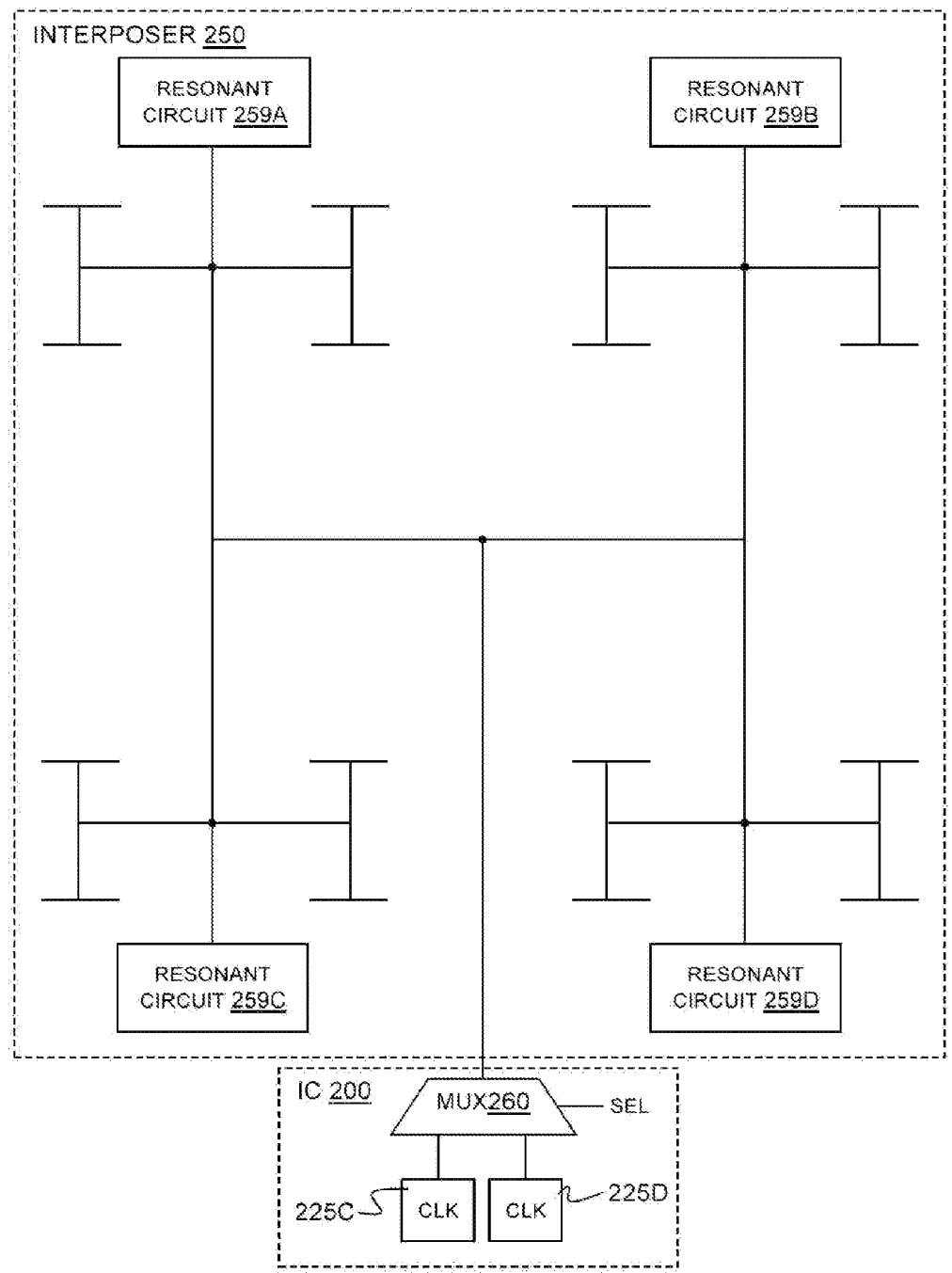
FIG. 2B shows an illustrative resonant clock tree in an interposer that may be driven by either one of two clock sources in accordance with certain embodiments of the present invention.

FIG. 2B shows an illustrative resonant clock tree in interposer 250 that may be driven by either clock source 225C and 225D in accordance with embodiments of the present invention. Clock sources 225C and 225D may be a PLL or DLL circuit on IC 200. In the embodiment of FIG. 2B, multiplexing circuit 260 is used to selectively transmit clock signals from either clock source 225C or clock source 225D to the resonant clock tree in interposer 250.

It should be noted that a 2-to-1 multiplexing circuit 260 with one select bit SEL is shown in FIG. 2B because two clock sources, namely, clock sources 225C and 225D, may be coupled to the resonant clock tree in interposer 250. Accordingly, when more than two clock sources are to be selectively coupled to a clock tree, a multiplexing circuit with more inputs and select bits may be used. As an example, to selectively couple three different clock sources to a clock tree network such as that shown in FIG. 2B, a 4-to-1 multiplexing circuit with two select bits may be used.

In the embodiment of FIG. 2B, the select bit SEL of multiplexing circuit 260 may receive an input signal from a user (e.g., the user may set a configuration random access memory (CRAM) bit to a particular value as the select bit SEL), and depending on the select bit SEL received, either one of clock source 225C or 225D may be coupled to the resonant clock tree in interposer 250. The resonant clock tree in interposer 250 may be part of a larger clock tree network (not shown in FIG. 2B) and each branch of the resonant clock tree may include one or more resonant circuit tuned to the same resonant frequency (e.g., resonant circuits 259A, 259B, 259C and 259D, respectively).

Figure 3:
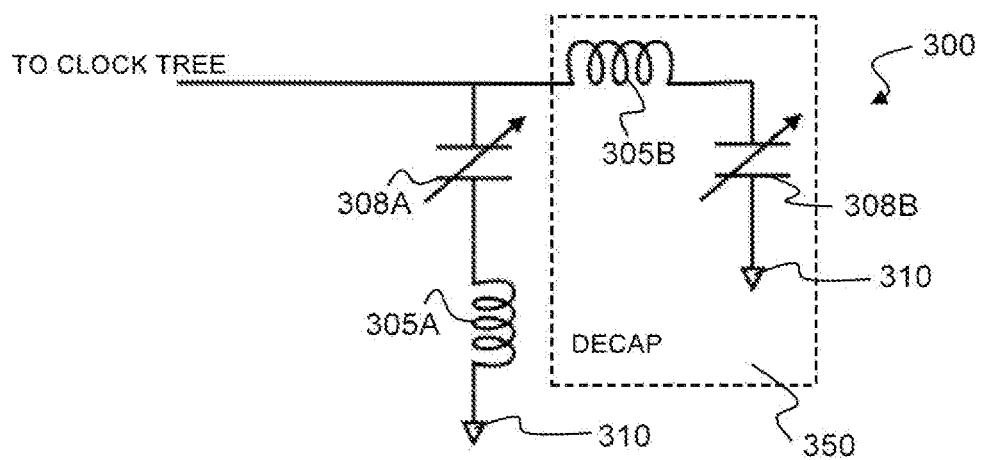
FIG. 3 shows an illustrative resonant circuit with passive components in accordance with certain embodiments of the present invention.

FIG. 3 shows an illustrative resonant circuit with passive components in accordance with embodiments of the present invention. Resonant circuit 300 as shown in FIG. 3 includes a series inductive-capacitive (LC) circuit with capacitor 308A and inductor 305A. Resonant circuit 300 may be coupled to any of the branches of the embedded resonant clock tree in interposer 250 of FIG. 2B (i.e., resonant circuit 300 may represent either or all of resonant circuits 259A-259D shown in FIG. 2B). In one embodiment, capacitor 308A is a variable capacitor or varactor that may be adapted to tune the frequency of resonant circuit 300. A decoupling capacitor may be included in a resonant circuit such as resonant circuit 300 to reduce signal noise. In the embodiment of FIG. 3, the decoupling capacitor is represented as another series LC circuit 350 that includes inductor 305B and capacitor 308B. The decoupling capacitor may be omitted from resonant circuit 300 if desired. It should be noted that specific details of an LC circuit and a decoupling capacitor are not described herein in order to not obscure the present invention.

Figure 4A:
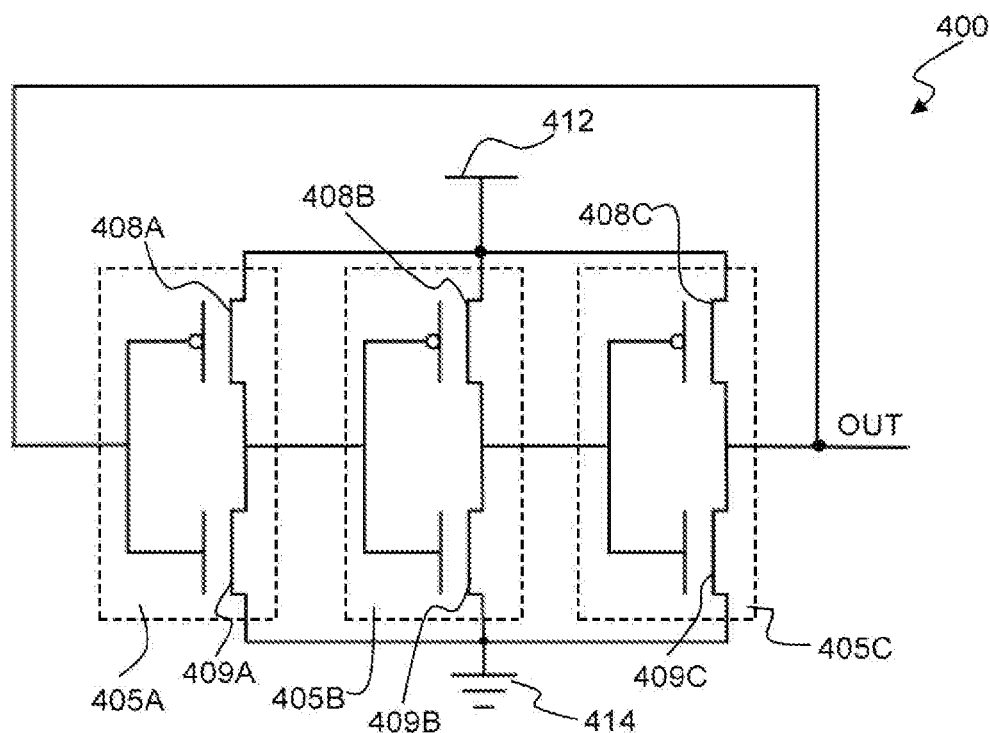
FIG. 4A shows a ring oscillator in accordance with certain embodiments of the present invention.

FIG. 4A shows a ring oscillator 400 in accordance with embodiments of the present invention. Ring oscillator 400 may be used as a resonant circuit in an embedded resonant clock tree network as described with reference to FIGS. 2A and 2B. It should be appreciated that a ring oscillator generally uses an odd number of inverter circuits in a ring configuration. In FIG. 4A, ring oscillator 400 includes three inverter circuits 405A, 405B and 405C coupled in a ring configuration, with the output OUT of inverter circuit 405C feeding back to the input of inverter circuit 405A.

As is known, an inverter circuit may be formed by a pair of transistors. In the embodiment of FIG. 4A, inverter circuit 405A is formed by p-channel metal-oxide-semiconductor field effect transistor (PMOS) 408A and re-channel metal-oxide-semiconductor field effect transistor (NMOS) 409A. Similarly, inverter 405B is formed by PMOS 408B and NMOS 409B, and inverter 405C is formed by PMOS 408C and NMOS 409C. A source-drain terminal of each of the PMOS transistors 408A-408C is coupled to a voltage level 412 while a source-drain terminal of each of the NMOS transistors 409A-409C is coupled to a ground voltage 414.

When ring oscillator 400 is used as a resonant circuit in an embedded clock tree network for an IC device, ring oscillator 400 may be powered by the IC device. For example, ring oscillator 400 may be used in embedded resonant clock tree network in interposer 250 of FIG. 2A. As such, in this scenario, IC 200 of FIG. 2A may supply the voltage level 412 to ring oscillator 400. It should be noted that the frequency of a ring oscillator such as that shown in FIG. 4A may be adjusted by adjusting its voltage supply or the number of delay stages in the ring oscillator.

It should be noted that a larger number of delay stages (e.g., when more inverter circuits is used in a ring oscillator) may lower the oscillation frequency of ring oscillator 400. Accordingly, to decrease the frequency of ring oscillator 400, voltage level 412 may be decreased or the number of delay stages may be increased. Further details of the actual operation of a ring oscillator circuit such as ring oscillator 400 are not described herein in order to not obscure the present invention.

Figure 4B:
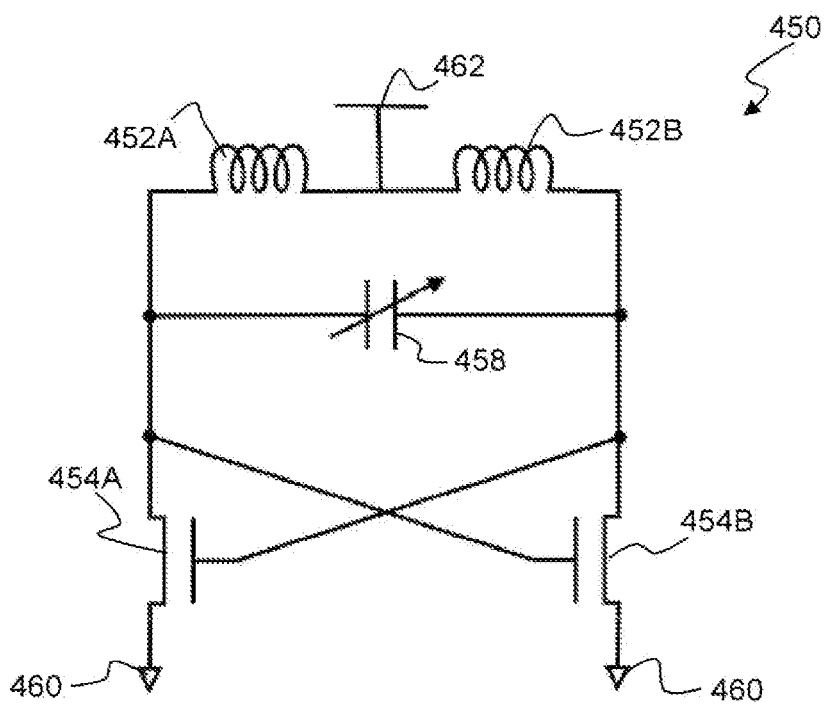
FIG. 4B shows an inductive-capacitive (LC) voltage-controlled oscillator (VCO) circuit in accordance with certain embodiments of the present invention.

FIG. 4B shows an LC voltage-controlled oscillator (VCO) circuit 450 in accordance with embodiments of the present invention. LC VCO circuit 450 is a cross-coupled N-type metal-oxide-semiconductor field effect (NMOS) LC oscillator that includes a pair of cross-coupled NMOS transistors 454A and 454B, inductors 452A and 452B, and varactor 458. LC VCO circuit 450 receives a voltage level 462 and is coupled to a ground voltage 460. The oscillation frequency of LC VCO circuit 450 may be tuned using varactor 458. Specific details of the actual operation of LC VCO circuit 450 are not described in order to not unnecessarily obscure the present invention.

In one embodiment, LC VCO circuit 450 may be used as a resonant circuit in an embedded resonant clock tree network in interposer 250 of FIG. 2A. Accordingly, an IC such as IC 200 of FIG. 2A may supply the voltage level 462 to LC VCO circuit 450. It should be appreciated that even though specific circuit configurations are shown in FIGS. 3, 4A and 4B, other resonant circuits may be used in this context (e.g., cross-coupled P-type metal-oxide-semiconductor field effect (PMOS) LC oscillators, cross-coupled oscillators with PMOS and NMOS differential pairs, Colpitts oscillators, etc.).

Figure 5:
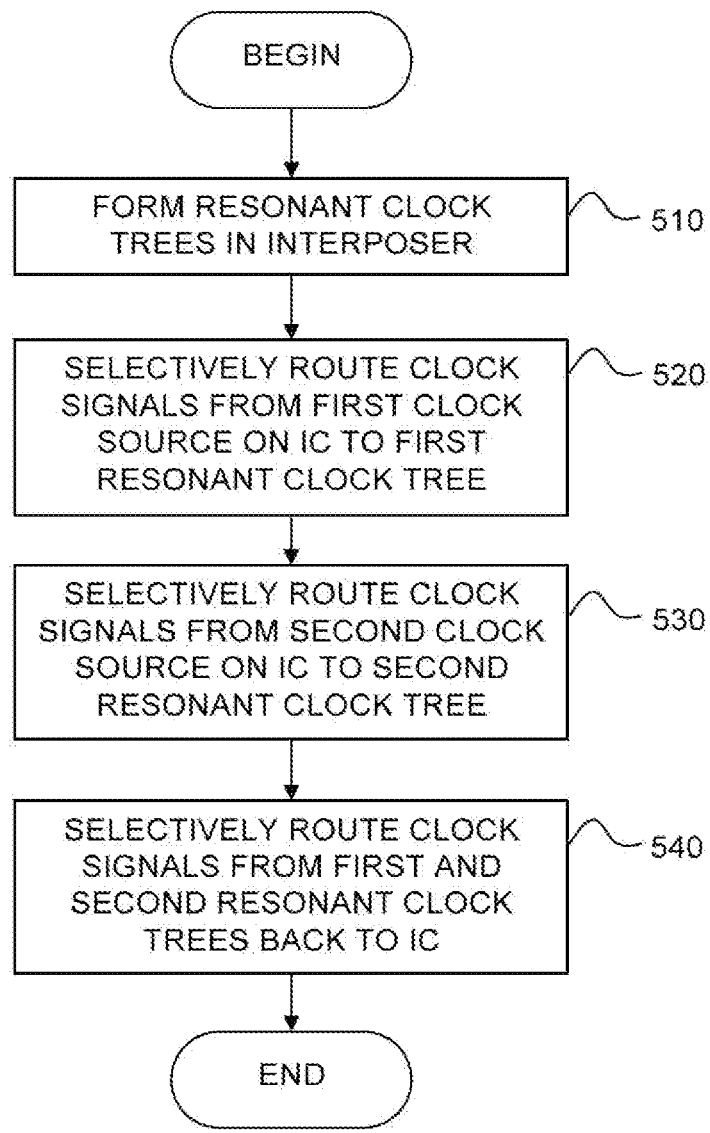
FIG. 5 depicts the steps of forming a clock network for an integrated circuit in an integrated circuit package in accordance with certain embodiments of the present invention.

FIG. 5 depicts the steps of forming a clock network for an integrated circuit in an integrated circuit package in accordance with embodiments of the present invention. At step 510, resonant clock trees are formed in an interposer. The resonant clock trees may collectively form a resonant clock tree network in the interposer such as that shown in interposer 250 of FIG. 2A. As such, the resonant clock trees may include any or all of the resonant circuits shown in FIGS. 3, 4A and 4B. At step 520, clock signals from a first clock source on an IC are selectively routed to a resonant clock tree in the interposer and clock signals from a second clock source on the IC are selectively routed to another resonant clock tree in the interposer at step 530. The clock signals from the respective clock sources may be routed from the IC to the interposer via various interconnects that electrically couple the IC to the interposer.

At step 540, clock signals from the resonant clock trees in the interposer may be selectively routed back to the IC via the various interconnects (e.g., through silicon vias (TSVs), contact pads, microbumps, etc.). In one embodiment, the clock signals from the resonant clock trees are sinusoidal signals, and as such, when they are routed back to the IC, the sinusoidal signals are converted to square waves before being transmitted as clock signals to other parts of the IC. As an example, circuitry to convert the signals from one form to another may include a Schmitt trigger. Such circuitry may be included in the IC to receive clock signals from the resonant clock trees in the interposer before transmitting the converted signals to other parts of the IC.

Figure 6A:
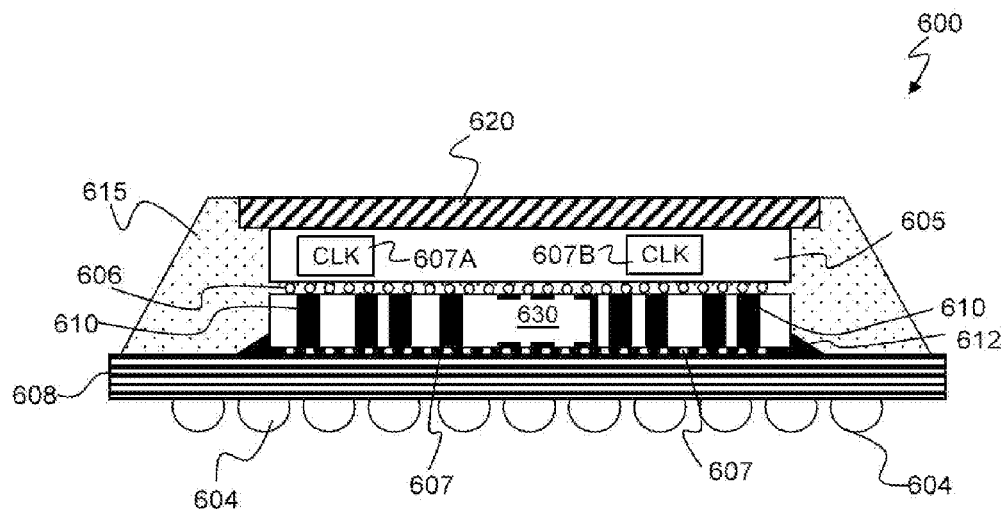
FIG. 6A is a side view of an illustrative integrated circuit package with a die disposed over an interposer in accordance with certain embodiments of the present invention.

FIG. 6A is a side view of an illustrative IC package 600 with a die 605 disposed over an interposer 630 in accordance with embodiments of the present invention. IC package 600 includes package substrate 608, molding compound 615, and heat spreader 620. In FIG. 6A, die 605 and interposer 630 may be encapsulated by molding compound 615 (e.g., an epoxy resin compound). Heat spreader 620 is placed over die 605 and interposer 630 to allow heat to escape from IC package 600. Heat spreader 620 may be connected to die 605 through a non-conductive adhesive (not shown). It should be noted that die 605 shown in FIG. 6A is a flip chip die with microbumps 606 on one of its surfaces. Flip chip die 605 is disposed on interposer 630, which is in turn disposed on package substrate 608.

Microbumps 607 (which may be similar to microbumps 606) on the underside of interposer 630 connects interposer 630 to package substrate 608. It should be appreciated that the cavity between the microbumps 607 on interposer 630 package substrate 608 may be filled with under-fill material 612 or sealing resin to fill the gap and protect the solder joints between microbumps 607 and package substrate 608. Solder balls 604 on the bottom surface of package substrate 608 may connect IC package 600 to other circuitry (e.g., a printed circuit board (PCB)). Thus, signals from die 605 may be transmitted to package substrate 608 through interposer 630 before being transmitted outside of IC package 600 through package substrate 608 by solder balls 604.

Interposer 630 may include active or passive components, such as transistors, capacitors, inductors, and the like, that are connected to die 605. As an example, interposer 630 may include a resonant circuit formed by passive components (e.g., capacitors and inductors) such as resonant circuit 300 shown in FIG. 3. As another example, interposer 630 may be another IC that includes circuitry with active components (e.g., transistors or inverter circuits) such as those shown in FIGS. 4A and 4B. As such, in the embodiment of FIG. 6A, interposer 630 may include an embedded clock tree network, similar to that shown in FIG. 2A, with a resonant clock tree that is driven by a clock source in die 605. Accordingly, clock signals from clock sources 607A and 607B in die 605 may be routed to the embedded clock tree network in interposer 630 before being routed back to different parts of die 605 via various interconnects (e.g., microbumps, TSVs, wires, etc.) on interposer 630 and die 605. As shown in FIG. 6A, interposer 630 includes multiple TSVs that may be used to route clock signals from its embedded clock tree network (not shown) back to die 605.

Figure 6B:
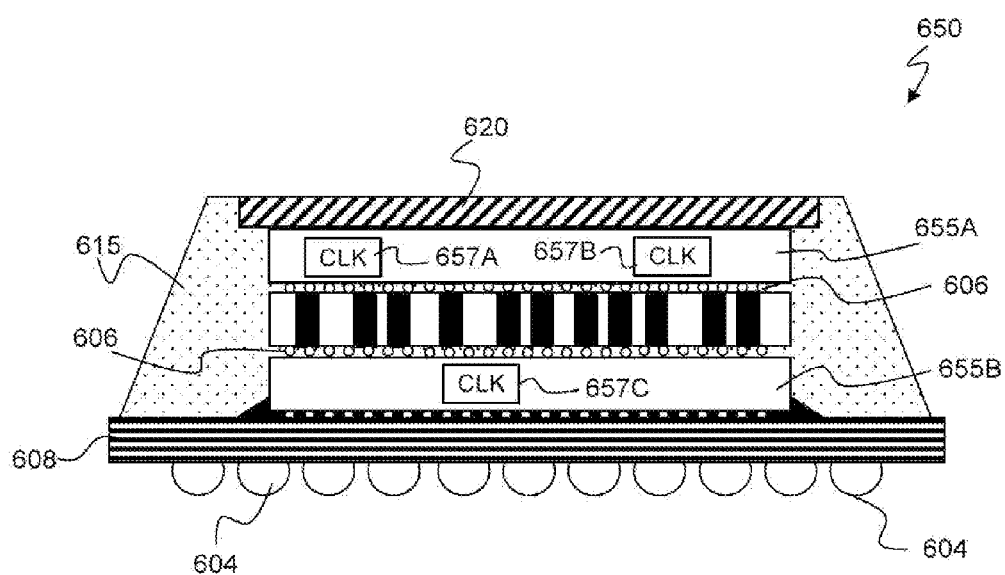
FIG. 6B shows a multi-chip integrated circuit package in accordance with certain embodiments of the present invention.

FIG. 6B shows a multi-chip IC package 650 in accordance with embodiments of the present invention. It should be noted that IC package 650 shares similarities with IC package 600 of FIG. 6A and as such, for the sake of brevity, elements that have been described above (e.g., molding compound 615, heat spreader 620, package substrate 608, and solder balls 604) are not described in detail again. The multi-chip IC package 650 contains two dies 655A and 655B, and an interposer 630 sandwiched between them.

Die 655A that is disposed over interposer 630 includes two clock sources 657A and 657B while die 655B that is placed below interposer 630 includes another clock source 657C. As described above with reference to FIG. 6A, interposer 630 may include an embedded clock tree network. The embedded clock tree network may be a resonant clock tree network that is driven by clock sources in dies 655A and 655B. For example, the embedded clock tree network in interposer 630 may include at least three sub-networks (or resonant clock trees). Each of the three sub-networks may be driven by the respective clock sources in dies 655A and 655B (i.e., a sub-network may be driven by clock source 657A, another sub-network may be driven by clock source 657B, and yet another sub-network may be driven by clock source 657C). In one embodiment, the different clock sources 657A, 657B, and 657C may provide clock signals at different frequencies. Accordingly, clock signals from dies 655A and 655B may travel between the respective dies and interposer 630 via various interconnect paths that are formed by, among others, microbumps 606, TSVs 610, and contact pads (not shown) on interposer 630 and die 655B.

A multi-chip package with multiple dies and interposer (or interposers) stacked on top of each other such as that shown in FIG. 6B is commonly referred to as a 3-dimensional (3D) package configuration. Even though two dies 655A and 655B, and one interposer 630 are shown in the embodiment of FIG. 6B, it should be appreciated that more dies (or even interposers) may be used in this context. That is to say, the embedded clock network in interposer 630 may be driven by multiple different clock sources from different dies in the IC package. Alternatively, when more interposers, each with its own embedded clock network, are used, the embedded clock networks in the respective interposers may collectively form a global clock network for that multi-chip IC package.

Figure 6C:
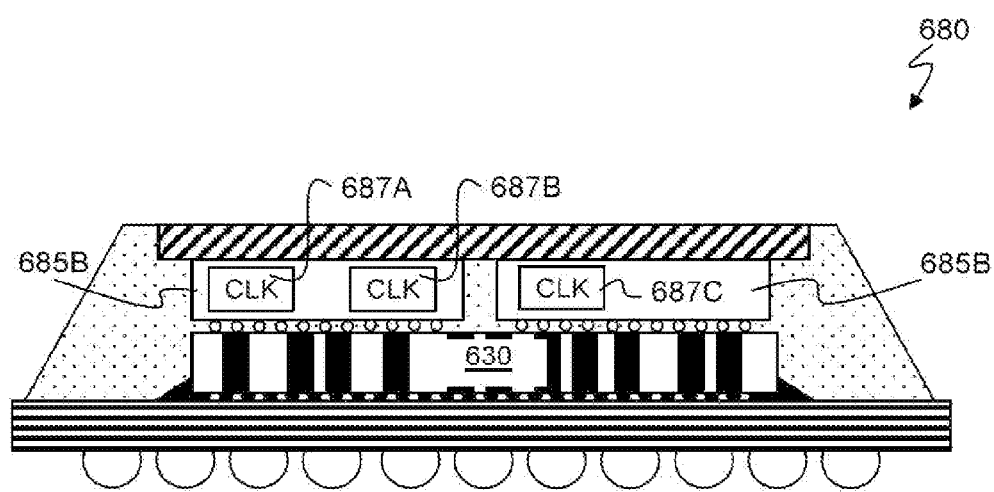
FIG. 6C shows another multi-chip integrated circuit package in accordance with certain embodiments of the present invention.

FIG. 6C shows a multi-chip IC package 680 in accordance with embodiments of the present invention. Unlike multi-chip IC package 650 where dies 655A and 655B, and interposer 630 are stacked on top of each other, dies 685A and 685B in IC package 680 are placed adjacent to each other on interposer 630. Such an IC package may commonly be referred to as a 2.5-dimensional (2.5D) IC package. In one embodiment, dies 685A and 685B shares a common clock tree network. The shared common clock tree network may be a resonant clock tree network embedded in interposer 630 (as described above with reference to FIGS. 6A and 6B).

The respective clock sources 687A, 687B, and 687C on dies 685A and 685B may be coupled to drive the embedded clock tree network in interposer 630. As mentioned, the embedded clock tree network may include multiple sub-networks or resonant clock trees. As such, each of the clock sources 687A, 687B, and 687C may drive different sub-networks or groups of sub-networks. In one embodiment, a clock tree or sub-network in the embedded clock tree network in interposer 630 may be driven by multiple clock sources. In this case, at any one time, the clock tree may be driven by a different clock source. As shown in FIG. 2B, a multiplexing circuit 260 may be used to selectively transmit clock signals from a desired clock source to the clock tree. It should be noted that the clock sources referred to herein (with reference to FIGS. 6A-6C) may include PLLs, DLLs, and clock buffers (or any combination thereof).

It should be appreciated that even though specific configurations are shown in the embodiments of FIGS. 6A, 6B, and 6C, different configurations may be employed in this context. It should be appreciated that a flip chip package with a ball grid array is provided in the exemplary illustrations of FIGS. 6A-6C. However, the use of flip chip ball grid array IC packages is not meant to be limiting as the techniques described herein may be applied to other packaging configurations (e.g., heat spreader ball grid arrays (HSBGAs), low profile ball grid arrays (LBGAs), thin fine pitch ball grid array (TFBGAs), flip chip chip-scale packages (FCCSPs), etc).

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit package comprising:
   an interposer with a plurality of clock trees forming an embedded clock network; and
   a die having first and second clock circuits disposed over the interposer, wherein the first clock circuit provides clock signals at a first frequency to a first clock tree of the plurality of clock trees, wherein the second clock circuit provides clock signals at a second frequency that is different from the first frequency to a second clock tree of the plurality of clock trees, and wherein at least one of the first and second clock trees comprises a resonant clock tree.

2. The integrated circuit package defined in claim 1, wherein the resonant clock tree comprises:
   a resonant circuit formed by at least one inductor and a capacitor.

3. The integrated circuit package defined in claim 2, wherein the capacitor comprises a variable capacitor that is adapted to tune a frequency of the resonant circuit.

4. The integrated circuit package defined in claim 1 further comprising:
   a multiplexing circuit coupled to outputs of the first and second clock circuits, wherein the multiplexing circuit selectively transmits clock signals from one of the first and second clock circuits to at least one of the first and second clock trees.

5. The integrated circuit package defined in claim 1 further comprising:
   an additional die having a third clock circuit, wherein the die and the additional die are disposed adjacent to each other over the interposer, and wherein the third clock circuit provides clock signals at a third frequency to a third clock tree of the plurality of clock trees.

6. The integrated circuit package defined in claim 1 further comprising:
   a package substrate; and
   an additional die having a third clock circuit disposed over a surface of the package substrate, wherein the interposer is disposed between the additional die and the die having the first and second clock circuits, and wherein the third clock circuit provides clock signals at a third frequency to a third clock tree of the plurality of clock trees.

7. The integrated circuit package defined in claim 1, wherein the resonant clock tree comprises:
   a plurality of inverter circuits coupled in a ring configuration.

8. The integrated circuit package defined in claim 1, wherein the resonant clock tree comprises:
   an inductive-capacitive (LC) voltage control oscillator circuit that receives a voltage level from the die and that tunes a frequency of the resonant clock tree.

9. The integrated circuit package defined in claim 1, wherein the interposer comprises a plurality of through-silicon vias that receives clock signals from the first and second clock circuits in the die and that transmits clock signals from the embedded clock network to the die.

10. An integrated circuit package comprising:
    a die having a plurality of clock sources; and
    an interposer coupled to the die via a plurality of interconnects, wherein the interposer comprises a resonant clock tree network that is driven by a clock signal generated by at least one clock source of the plurality of clock sources on the die, and wherein a given one of the plurality of interconnects transmits the clock signal from the resonant clock tree network on the interposer to the die.

11. The integrated circuit package defined in claim 10, wherein the plurality of interconnects comprises a plurality of microbumps on the die and a plurality of through-silicon vias in the interposer.

12. The integrated circuit package defined in claim 10, wherein the resonant clock tree network comprises a plurality of sub-networks, and wherein each sub-network of the plurality of sub-networks is adapted to receive clock signals over a plurality of frequency bands from the plurality of clock sources.

13. The integrated circuit package defined in claim 12, wherein at least one sub-network of the plurality of sub-networks comprises:
    a resonant circuit with at least one variable capacitor that is tuned to operate at a selected frequency.

14. The integrated circuit package defined in claim 12, wherein at least one sub-network of the plurality of sub-networks comprises:
    a ring oscillator formed by a plurality of inverter circuits, wherein the ring oscillator receives a voltage level from the die that determines an operating frequency of the ring oscillator.

15. The integrated circuit package defined in claim 12, wherein at least one sub-network of the plurality of sub-networks comprises:
    an inductive-capacitive (LC) voltage-controlled oscillator circuit that receives a voltage level from the die, wherein an operating frequency of the LC voltage-controlled oscillator circuit is adjusted based on the voltage level.

16. The integrated circuit package defined in claim 10 further comprising:
    an additional die having an additional clock source, wherein the interposer comprises an additional resonant clock tree network that is driven by the additional clock source.

17. A method of forming a clock network for an integrated circuit in an integrated circuit package, the method comprising:
    forming a plurality of resonant clock trees in an interposer;
    selectively routing clock signals from a first clock source on the integrated circuit to a first resonant clock tree of the plurality of clock trees;

selectively routing clock signals from a second clock source on the integrated circuit to a second resonant clock tree of the plurality of clock trees; and selectively routing clock signals from the first and second resonant clock trees via through silicon vias in the interposer to the integrated circuit, wherein the first and second resonant clock trees form at least a portion of the clock network for the integrated circuit.

18. The method defined in claim 17, wherein the clock signals from the first and second resonant clock trees comprise sinusoidal clock signals, the method further comprising:

providing circuitry on the integrated circuit for converting the sinusoidal clock signals to square waves.

19. The method defined in claim 17, wherein at least one of the first and second resonant clock trees comprises a resonant circuit formed by at least and inductor and a variable capacitor, the method further comprising:

with the variable capacitor, tuning a frequency of the at least one of the first and second resonant clock trees.

20. The method defined in claim 17, wherein at least one of the first and second resonant clock trees comprises a ring oscillator, the method further comprising:

providing a voltage level to the ring oscillator to adjust a frequency of the ring oscillator.

* * * * *